(12) United States Patent
Kawai et al.

(10) Patent No.: US 10,720,935 B2
(45) Date of Patent: Jul. 21, 2020

(54) ANALOG-TO-DIGITAL CONVERTER, ANALOG-TO-DIGITAL CONVERSION METHOD, AND DISPLACEMENT DETECTING APPARATUS

(71) Applicant: MITUTOYO CORPORATION, Kawasaki-shi, Kanagawa (JP)

(72) Inventors: Akio Kawai, Yokohama (JP); Shun Mugikura, Kawasaki (JP)

(73) Assignee: MITUTOYO CORPORATION, Kawasaki (JP)

( * ) Notice: Subject to any disclaimer, the term of this patent is extended or adjusted under 35 U.S.C. 154(b) by 0 days.

(21) Appl. No.: 16/440,103

(22) Filed: Jun. 13, 2019

(65) Prior Publication Data
US 2020/0007139 A1    Jan. 2, 2020

(30) Foreign Application Priority Data

Jun. 28, 2018   (JP) ................................. 2018-123095

(51) Int. Cl.
*H03M 1/12*    (2006.01)
(52) U.S. Cl.
CPC ................................ *H03M 1/1245* (2013.01)

(58) Field of Classification Search
CPC .... H03M 1/1245; H03M 1/162; H03M 1/164; H03M 1/40; H03M 1/44
USPC .................................................. 341/155, 161
See application file for complete search history.

(56) References Cited

U.S. PATENT DOCUMENTS

| | | | | |
|---|---|---|---|---|
| 5,159,342 A | * | 10/1992 | Yotsuyanagi | H03M 1/168 341/156 |
| 7,088,275 B2 | * | 8/2006 | Waltari | H03M 1/144 327/158 |

FOREIGN PATENT DOCUMENTS

JP    2008-028820 A    2/2008

* cited by examiner

*Primary Examiner* — Khai M Nguyen
(74) *Attorney, Agent, or Firm* — Oliff PLC

(57) ABSTRACT

An analog-to-digital converter includes a cycle processing unit and a control unit. The cycle processing unit converts an analog input signal into a digital signal having a plurality of bits by performing a plurality of cycle processing on the analog input signal to acquire values of each bit in order from a higher-order bit to a lower-order bit. The control unit controls the cycle processing unit such that a period of the cycle processing is shortened according to a cycled number of the cycle processing.

13 Claims, 6 Drawing Sheets

ANALOG-TO-DIGITAL CONVERTER, ANALOG-TO-DIGITAL CONVERSION METHOD, AND DISPLACEMENT DETECTING APPARATUS

CROSS-REFERENCE TO RELATED APPLICATION

This application claims priority from Japanese Patent Applications No. 2018-123095 filed on Jun. 28, 2018, the entire subject-matter of which is incorporated herein by reference.

TECHNICAL FIELD

The present disclosure relates to an analog-to-digital converter, an analog-to-digital conversion method, and a displacement detecting apparatus.

BACKGROUND

As one type of an analog-to-digital (A/D) converter, an A/D converter called a cyclic type or an algorithmic type is known. A configuration of a general cyclic A/D converter is disclosed in, for example, JP-A-2008-28820.

This A/D converter includes an analog-to-digital (A/D) converting circuit, a digital-to-analog (D/A) converting circuit, an amplifier circuit, an input difference circuit, and two switches. The A/D converting circuit converts an input analog signal into a digital signal. The D/A converting circuit converts an output of the A/D converting circuit into an analog signal. The amplifier circuit amplifies an input analog signal. In JP-A-2008-28820, the amplifier circuit amplifies an input analog signal double. The input difference circuit calculates a difference between an output of the amplifier circuit and an output of the D/A converting circuit. By switching between the two switches, any one of an input analog signal and an output of the input difference circuit is selected and is input to the A/D converting circuit and the amplifier circuit.

In the A/D converter, an output of the input difference circuit that is sampled in a given cycle is input to the A/D converting circuit and the amplifier circuit in the next cycle such that the output is recursively converted in the A/D converting circuit. As a result, values of each bit can be acquired in order from the highest-order bit with repeated cycle processing. Accordingly, the A/D converter that converts an input analog signal into a digital signal having a number of bits, which is represented by the product of N and the number of bits of the A/D converting circuit, by repeating cycle processing N times ("N" represents an integer of 2 or more) can be configured.

As described above, in the general cyclic A/D converter, the resolution can be easily improved by increasing the number of cycle processing. However, an error generated in a given cycle is amplified double in the next cycle. That is, as the position of a bit including an error increases, the number of times the error is amplified increases, and the influence on a low-order bit increases. Accordingly, the resolution of the A/D converter is limited by an error generated from a high-order bit.

By sufficiently allocating a settling time required to settle the voltage a signal input to the A/D converter during the sampling of the signal, an error generated in each cycle can be reduced. As a result, the resolution of the A/D converter can be improved. However, in the general cyclic A/D converter, the periods of cycle processing are the same. Therefore, by increasing the settling time, the period of cycle processing also increases, and a total A/D conversion time required to complete A/D conversion increases. An increase in the A/D conversion time also leads to an increase in power consumption.

Thus, the improvement of the resolution of the A/D converter and a reduction in A/D conversion time have a trade-off relationship. Accordingly, it is difficult to simultaneously realize the improvement of the resolution of the A/D converter and a reduction in A/D conversion time.

SUMMARY

An object of the present disclosure is to provide an analog-to-digital converter, an analog-to-digital conversion method, and a displacement detecting apparatus that can perform high-speed analog-to-digital conversion with a high resolution.

According to the present disclosure, an analog-to-digital converter includes:

a cycle processing unit configured to convert an analog input signal into a digital signal having a plurality of bits by performing a plurality of cycle processing on the analog input signal to acquire values of each bit in order from a higher-order bit to a lower-order bit; and a control unit configured to control the cycle processing unit such that a period of the cycle processing is shortened according to a cycled number of the cycle processing.

"N" represents an integer of 2 or more, and the cycle processing unit converts the analog input signal into a digital signal having N bits by performing the cycle processing N times on the analog input signal to acquire a 1-bit value in each of the cycle processing.

When "$\tau$" represents a time constant of the analog-to-digital converter, and "i" represents an integer of 1 to N, a period $T_i$ of the cycle processing between (i+1)-th cycle processing and i-th cycle processing is represented by the following expression:

$$T_i > \tau\{(N-i)\ln 2 + \ln(N-1)\}.$$

An input signal used in first cycle processing is the analog input signal, an input signal used in the (i+1)-th cycle processing is a sample signal that is sampled in the i-th cycle processing, in a case where an i-th bit obtained in the i-th cycle processing is "1", the cycle processing unit subtracts a reference voltage from a voltage of the input signal, and samples a voltage obtained by amplifying the subtracted value double to generate the sample signal, and in a case where the i-th bit is "0", the cycle processing unit samples a voltage obtained by amplifying the input signal double to generate the sample signal.

In a case where the input signal has a voltage higher than the reference voltage, the i-th bit is "1", and in a case where the input signal has a voltage lower than the reference voltage, the i-th bit is "0".

The cycle processing unit includes:

a comparator that compares the input signal with the reference voltage to output a comparison result as the i-th bit;

a D/A converting circuit that outputs the reference voltage in a case where the i-th bit is "1";

a subtractor that outputs a voltage obtained by subtracting an output voltage of the D/A converting circuit from the input signal;

an amplifier that amplifies the voltage output from the subtractor double; and a sample holding circuit that samples a voltage amplified by the amplifier to output the sample signal.

An input signal used in first cycle processing is the analog input signal, an input signal used in the (i+1)-th cycle processing is a sample signal that is sampled in the i-th cycle processing, in a case where an i-th bit obtained in the i-th cycle processing is "1", the cycle processing unit samples a voltage obtained by subtracting a reference voltage from a voltage obtained by amplifying the input signal double to generate the sample signal, and in a case where the i-th bit is "0", the cycle processing unit samples a voltage obtained by adding the reference voltage to a voltage obtained by amplifying the input signal double to generate the sample signal.

In a case where the input signal has a voltage higher than a ground voltage, the i-th bit is "1", and in a case where the input signal has a voltage lower than the ground voltage, the i-th bit is "0".

The cycle processing unit includes:

a comparator that compares the input signal with the ground voltage to output a comparison result as the i-th bit;

a D/A converting circuit that outputs a voltage obtained by inverting a sign of the reference voltage in a case where the i-th bit is "1", and outputs the reference voltage in a case where the i-th bit is "0";

an amplifier that amplifies a voltage of the input signal double;

an adder that adds a voltage amplified by the amplifier and an output voltage of the D/A converting circuit to each other; and a sample holding circuit that samples a voltage added by the adder to output the sample signal.

The control unit controls the period by controlling a timing at which the sample holding circuit performs sampling.

The cycle processing unit further includes a selection circuit that outputs any one of the analog input signal and the sample signal to the comparator as the input signal, the analog signal being input to one input terminal of the selection circuit, and the sample signal being input from the sample holding circuit to another input terminal of the selection circuit, and the control unit controls the selection circuit such that the selection circuit outputs the analog input signal as the input signal in the first cycle processing, and outputs the sample signal as the input signal in second or subsequent cycle processing.

According to the present disclosure, a displacement detecting apparatus includes:

a displacement detector that outputs an analog signal representing a measured displacement; and a signal processing unit configured to detect a displacement based on the analog signal representing the measured displacement, in which the signal processing unit includes:

the above-described analog-to-digital converter; and an arithmetic unit configured to calculate the displacement based on a digital signal output from the analog-to-digital converter, in which the analog-to-digital converter receives an analog signal representing the measured displacement as the analog input signal to convert the received analog signal into the digital signal.

According to the present disclosure, an analog-to-digital conversion method is provided in which an analog input signal is converted into a digital signal having a plurality of bits by performing a plurality of cycle processing on the analog input signal to acquire values of each bit in order from a higher-order bit to a lower-order bit, the method including a step of:

controlling the cycle processing such that a period of the cycle processing is shortened according to a cycled number of the cycle processing.

According to the present disclosure, it is possible to provide an analog-to-digital converter, an analog-to-digital conversion method, and a displacement detecting apparatus that can perform high-speed analog-to-digital conversion with a high resolution.

The above-described objects and other objects, characteristics, and advantageous effects of the present disclosure will be completely clarified with reference to the following detailed description and the accompanying drawings. The accompanying drawings are merely illustrative and do not limit the present disclosure.

DETAILED DESCRIPTION

Figure 1:
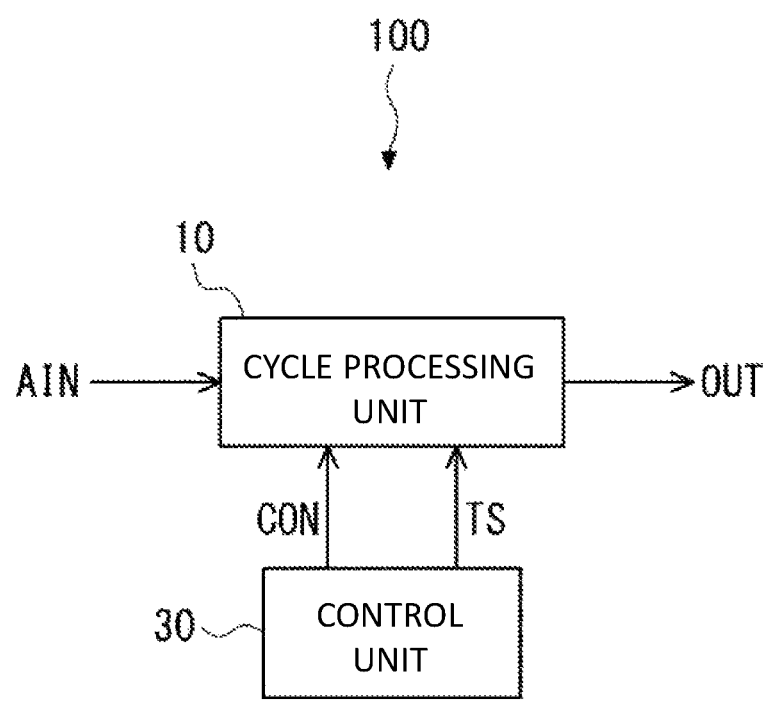
FIG. 1 is a diagram schematically illustrating a configuration of an analog-to-digital converter according to a first embodiment.

Hereinafter, an embodiment of the present disclosure will be described with reference to the drawings. In each of the drawings, the same components are represented by the same reference numerals, and the description thereof will not be repeated as necessary.

First Embodiment

Hereinafter, an analog-to-digital (A/D) converter according to a first embodiment will be described. The A/D converter according to the first embodiment is configured as a cyclic A/D converter that converts an analog input signal into a digital signal having a plurality of bits by performing a plurality of cycle processing. Specifically, this A/D converter converts an analog input signal into a digital signal having N bits by performing the cycle processing N times ("N" represents an integer of 2 or more). In other words, the A/D converter is a cyclic A/D converter having a resolution of N bits and can acquire values of each bit in order from the higher-order bit by performing the cycle processing N times on the analog input signal.

FIG. 1 schematically illustrates a configuration of the A/D converter 100 according to the first embodiment. The A/D converter 100 includes a cycle processing unit 10 and a control unit 30. The cycle processing unit 10 is configured as an A/D converting circuit that converts an analog input signal AIN into a digital signal OUT having a plurality of bits by performing cycle processing on the analog input signal AIN in the A/D converter 100 to acquire values of each bit in order from the higher-order bit to the lower-order bit. The control unit 30 controls the cycle processing to be performed by the cycle processing unit 10 by applying a control signal CON and a timing signal TS to the cycle processing unit 10.

Figure 2:
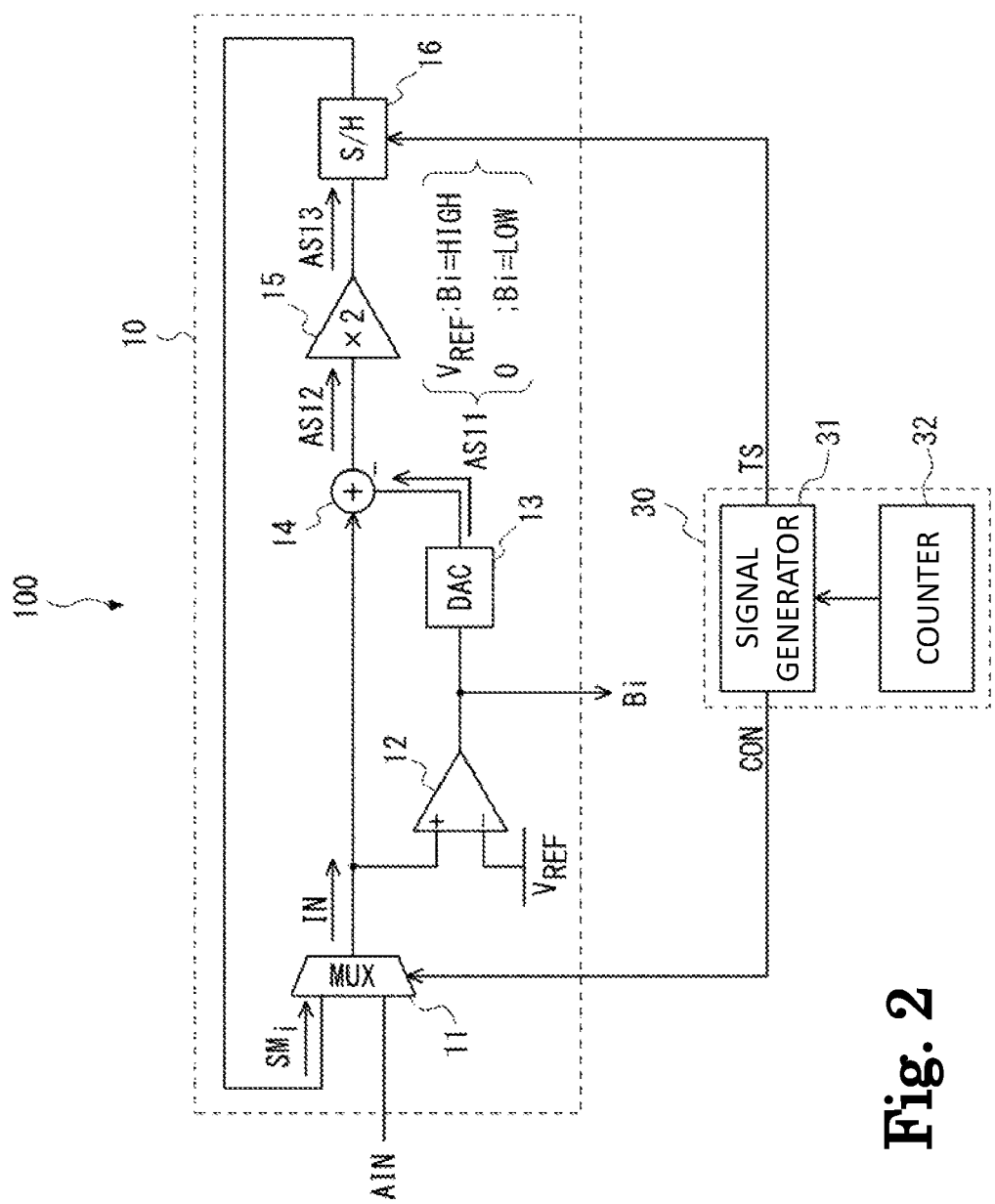
FIG. 2 is a diagram illustrating the configuration of the analog-to-digital converter according to the first embodiment in more detail.

FIG. 2 is a diagram illustrating the configuration of the A/D converter 100 according to the first embodiment in more detail. The cycle processing unit 10 includes a selection circuit 11, a comparator 12, a digital-to-analog (D/A) converting circuit 13, a subtractor 14, an amplifier 15, and a sample holding (S/H) circuit 16.

The selection circuit 11 is configured as a 2-input 1-output multiplexer (MUX). The analog input signal AIN is input to one input terminal of the selection circuit 11, and a sample signal $SM_i$ sampled by the S/H circuit 16 is input to another input terminal. Here, "i" is a value representing the cycled number of the cycle processing. "i" represents an integer of 1 to N−1. The selection circuit 11 outputs any one of the analog input signal AIN and the sample signal $SM_i$ as an input signal IN based on the control signal CON output from the control unit 30.

The comparator 12 compares the input signal IN output from the selection circuit 11 with a reference voltage $V_{REF}$ to output the comparison result as a binary signal Bi. When the voltage of the input signal IN is higher than the reference voltage $V_{REF}$, the comparator 12 outputs "1" (HIGH) as the binary signal Bi. When the voltage of the input signal IN is lower than the reference voltage $V_{REF}$, the comparator 12 outputs "0" (LOW) as the binary signal Bi. When the voltage of the input signal IN is equal to the reference voltage $V_{REF}$, the comparator 12 may output "0" (LOW) or "1" (HIGH) as the binary signal Bi as necessary.

In addition, the digital signal OUT including the higher-order bit to the lower-order bit is represented by the binary signal Bi output from the comparator 12 in each of the N cycle processing.

The D/A converting circuit 13 converts the binary signal Bi output from the comparator 12 into an analog signal AS11. When the binary signal Bi is "1" (HIGH), the D/A converting circuit 13 outputs the reference voltage $V_{REF}$ as the analog signal AS11. When the binary signal Bi is "0" (LOW), the D/A converting circuit 13 outputs 0, that is, a ground voltage as the analog signal AS11.

The subtractor 14 subtracts the analog signal AS11 output from the D/A converting circuit 13 from the input signal IN and outputs the subtracted signal to an analog signal AS12.

The amplifier 15 amplifies the analog signal AS12 output from the subtractor 14 double and outputs the amplified analog signal AS13.

According to the timing signal TS output from the control unit 30, the S/H circuit 16 samples the analog signal AS13 amplified by the amplifier 15 and outputs the sampled signal as the sample signal $SM_i$.

The control unit 30 controls an operation of the cycle processing unit 10 according to the cycled number "i" of the cycle processing. As illustrated in FIG. 2, the control unit 30 includes, for example, a signal generator 31 and a counter 32. The counter 32 counts the cycled number "i" of the cycle processing and outputs the count result to the signal generator 31. The signal generator 31 generates the control signal CON and the timing signal TS based on the count result.

In the first cycle processing, the control unit 30 controls the selection circuit 11 based on the control signal CON such that the analog input signal AIN is output from the selection circuit 11 to the comparator 12. Accordingly, in the first cycle processing, the comparator 12 receives the input signal IN as the analog input signal AIN.

In the second or subsequent cycle processing, the control unit 30 controls the selection circuit 11 based on the control signal CON such that a sample signal $SM_{i-1}$ sampled in the previous cycle processing is output to the comparator 12. Accordingly, in the second or subsequent cycle, the comparator 12 receives the sample signal $SM_{i-1}$ sampled in the previous cycle processing as the input signal IN.

In addition, the control unit 30 controls the S/H circuit 16 based on the timing signal TS such that a timing at which the S/H circuit 16 samples the signal is advanced along with an increase in the cycled number "i" of the cycle processing.

Specifically, the control unit 30 controls the S/H circuit 16 such that a time between a timing at which the S/H circuit 16 samples the signal in an i-th cycle processing and a timing at which the S/H circuit 16 samples the signal in an (i+1)-th cycle processing, that is, a period Ti of the cycle processing is shortened along with an increase in the cycled number "i" of the cycle processing.

In other words, the period Ti of the cycle processing between the i-th cycle processing and the (i+1)-th cycle processing monotonously decreases along with an increase in the cycled number "i" of the cycle processing. Accordingly, the period of the cycle processing is lengthened as the higher bit position, and the period of the cycle processing is shortened as the lower bit position.

In the above-described configuration, as the bit position increases, the period Ti of the cycle processing increases. Therefore, in a higher-order bit, a longer settling time can be allocated. Thus, the influence of errors accumulated in a sample signal $SM_{N-1}$ after the completion of (N−1)-th cycle processing can be reduced. As a result, the analog input signal AIN can be accurately converted into the digital signal OUT. Hereinafter, the reason for this will be described.

In the A/D converter 100, a settling time $t_i$ of each cycle processing required to reduce the influence of errors will be discussed. Regarding the step response, a voltage value $V(t_i)$ after the elapse of the settling time $t_i$ is represented by the following expression (1) using a time constant $\tau$, an initial voltage $V_0$, and a final voltage $V_\infty$ of the A/D converter 100.

$$V(t_i) = V_\infty - (V_\infty - V_0)e^{-\frac{t_i}{\tau}} \qquad (1)$$

An error $\varepsilon_i$ generated in the i-th cycle processing is represented by the following expression (2) using a difference between the voltage value $V(t_i)$ after the elapse of the settling time $t_i$, which is obtained by expression (1), and the final voltage $V_\infty$.

$$\varepsilon_i = V_\infty - V(t_i) = (V_\infty - V_0)e^{-\frac{t_i}{\tau}} \qquad (2)$$

In the A/D converter 100, a maximum value among variations of the sample signals $SM_i$ generated in each cycle processing is $\pm V_{REF}$. When an error is evaluated assuming the maximum value among the variations, the influence of errors accumulated in the sample signal SMN-1 after the completion of the (N−1)-th cycle processing does not exceed the influence of the error. Accordingly, in the following description, as the error $\varepsilon_i$, a worst value of an error in each of the cycle processing is used. In this case, the following expression (3) is obtained by substituting $\pm V_{REF}$ into ($V_\infty - V_0$) in expression (2).

$$\varepsilon_i = (V_\infty - V_0)e^{-\frac{t_i}{\tau}} = \pm V_{REF} e^{-\frac{t_i}{\tau}} \quad (3)$$

In a general cyclic A/D converter, the error $\varepsilon_i$ generated in the i-th cycle processing is amplified double in the next (i+1)-th cycle processing. In addition, an error $\varepsilon_{i+1}$ generated in the (i+1)-th cycle processing is added. Accordingly, a maximum error E included in the input signal IN (sample signal $SM_{N-1}$) that is output from the comparator 12 in the N-th cycle processing is represented by the following expression (4).

$$E = \varepsilon_1 2^{N-1} + \varepsilon_2 2^{N-2} + \ldots + \varepsilon_{N-2} 2^1 + \varepsilon_{N-1} 2^0 \quad (4)$$

In the A/D converter 100 having a resolution of N bits, in order to accurately output the lowest-order bit (binary signal $B_N$) in the final N-th cycle processing, the error E included in the input signal IN of the N-th cycle processing only has to be lower than half of the lowest-order bit, that is, the reference voltage $V_{REF}$. In this case, it is necessary that the error E satisfies the following expression (5).

$$|E| < 0.5 V_{REF} \quad (5)$$

In addition, in the A/D converter 100, an A/D conversion time $t_{ADC}$ required for A/D conversion of N bits is represented by the following expression (6).

$$t_{ADC} = \sum_{i=1}^{N-1} t_i \quad (6)$$

In order to minimize the A/D conversion time $t_{ADC}$ while satisfying expression (5), the settling time ti required for each of the cycle processing only has to be set such that the contribution of the error included in the input signal in the lowest-order bit is uniform in each of the cycle processing. In this case, it is necessary to satisfy the following expression (7).

$$\varepsilon_1 2^{N-1} = \varepsilon_2 2^{N-2} = \ldots = \varepsilon_{N-2} 2^1 = \varepsilon_{N-1} 2^0 = \varepsilon_i 2^{N-1-i} = \frac{E}{N-1} \quad (7)$$

By substituting expressions (3) and (7) into expression (5), the following expression (8) is obtained.

$$V_{ref} e^{-\frac{t_i}{\tau}} 2^{N-1-i} < \frac{0.5 V_{REF}}{N-1} \quad (8)$$

Based on expression (8), the settling time $t_i$ required in the i-th cycle processing is represented by the following expression (9).

$$t_i > \tau\{(N-i)\ln 2 + \ln(N-1)\} \quad (9)$$

From the above, the settling time ti in the i-th cycle processing satisfies expression (9), the error E can be minimized. The settling time $t_i$ in the i-th cycle processing is included in the period Ti of the cycle processing between the i-th cycle processing and the (i+1)-th cycle processing, and the period Ti also changes depending on the length of the settling time $t_i$.

In addition, the A/D conversion time $t_{ADC}$ in this case is represented by the following expression (10).

$$t_{ADC} = \sum_{i=1}^{N-1} t_i > \frac{1}{2} \tau N(N-1) \ln 2 + (N-1) \ln(N-1) \quad (10)$$

Figure 3:
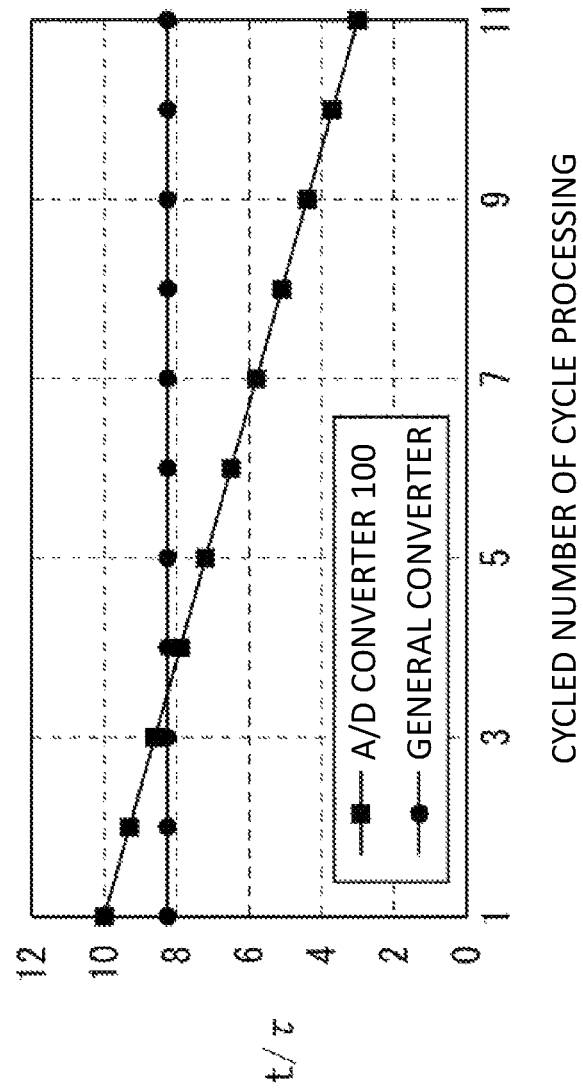
FIG. 3 is a diagram illustrating a comparison result of the analog-to-digital conversion between the analog-to-digital converter according to the first embodiment and a general cyclic analog-to-digital converter.

Next, an example of the A/D converter 100 will be described. FIG. 3 illustrates a comparison result of the A/D conversion between the A/D converter 100 according to the embodiment and the general cyclic A/D converter. In this example, the resolutions of the A/D converter 100 and the general cyclic A/D converter are 12 bits. In FIG. 3, the horizontal axis represents the cycled number of the cycle processing, and the vertical axis represents a value obtained by dividing the settling time in each of the cycle processing by the time constant of the A/D converter.

As illustrated in FIG. 3, in the general A/D converter, the periods of each cycle processing, that is, the settling times thereof are the same. On the other hand, in the A/D converter 100 according to the embodiment, the period between each cycle processing, that is, the settling time thereof decreases along with an increase in the cycled number of the cycle processing.

In the A/D converter 100, the settling time is longer than that of the general A/D converter until the third cycle processing and is shorter than that of the general A/D converter in the fourth or subsequent cycle processing. As a result, the A/D conversion time in the A/D converter 100 is shorter than that of the general A/D converter and is about 0.79 times that of the general A/D converter. That is, with the configuration of the A/D converter 100, the A/D conversion time can be reduced to be shorter than that of the general A/D converter.

Figure 4:
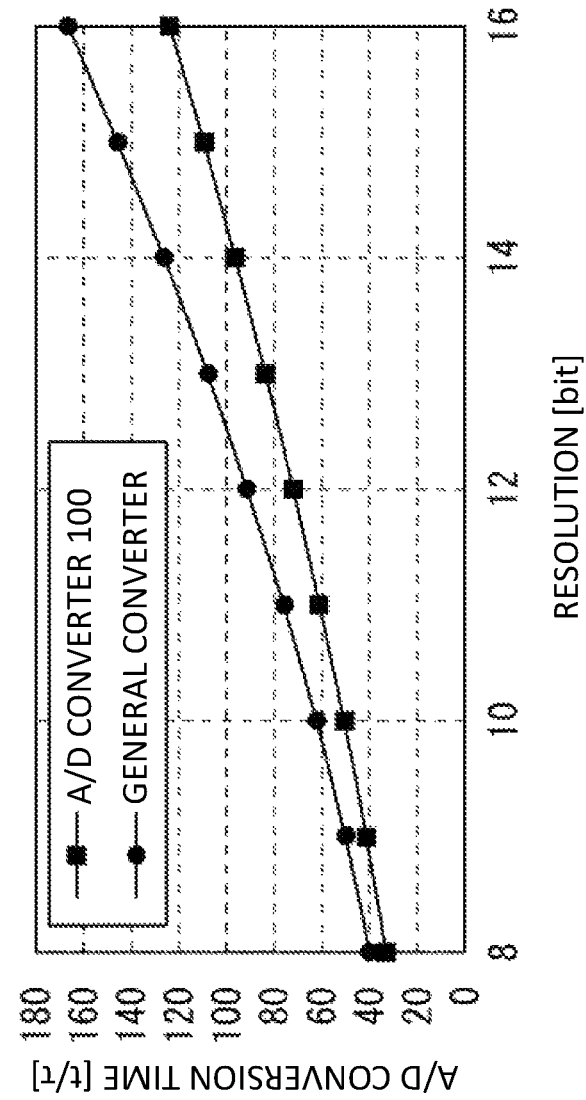
FIG. 4 is a diagram illustrating a comparison result of the analog-to-digital conversion time between the analog-to-digital converter according to the first embodiment and a general cyclic analog-to-digital converter.

FIG. 4 illustrates a comparison result of the A/D conversion time between the A/D converter 100 according to the embodiment and the general cyclic A/D converter. In FIG. 4, the horizontal axis represents the resolution of the A/D converter, and the vertical axis represents the A/D conversion time. As illustrated in FIG. 4, it can be understood that, as the resolution becomes higher, the result of the reduction in A/D conversion time of the A/D converter 100 is further improved.

According to the above-described configuration, the A/D conversion time can be reduced. Therefore, the power consumption can be further reduced as compared to the general A/D converter.

Figure 5:
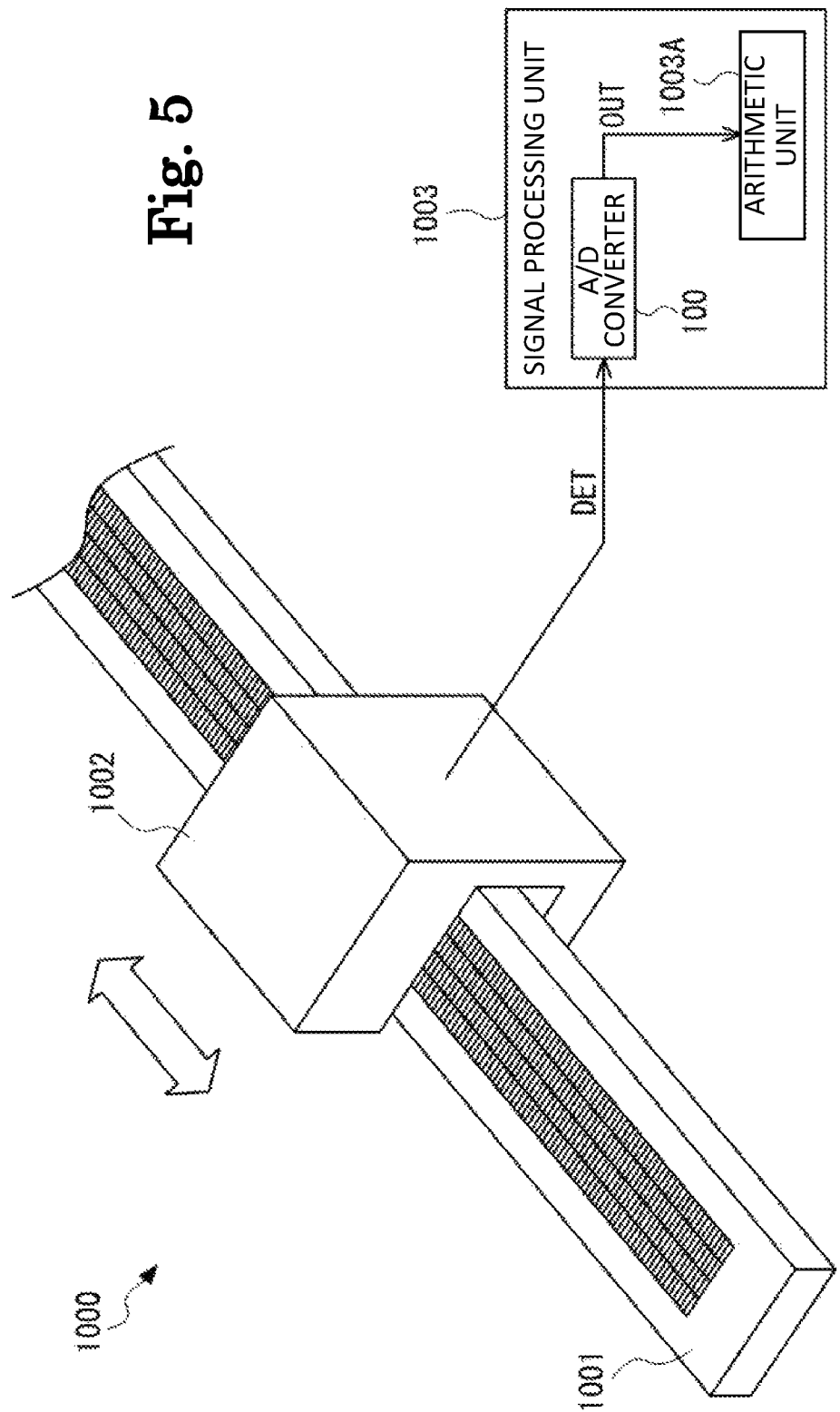
FIG. 5 is a diagram schematically illustrating a configuration of an optical encoder on which the analog-to-digital converter according to the first embodiment is mounted.

The A/D converter 100 according to the embodiment is applicable to, for example, the analog-to-digital conversion in a displacement detecting apparatus such as an encoder. FIG. 5 schematically illustrates a configuration of an optical encoder 1000 on which the A/D converter 100 according to the embodiment is mounted. The optical encoder 1000 is configured as a transmissive or reflective encoder.

As illustrated in FIG. 5, the optical encoder 1000 includes a scale 1001, a detection head 1002, and a signal processing unit 1003. The scale 1001 and the detection head 1002 are configured to move relative to each other along a measurement direction as a longitudinal direction of the scale 1001.

In the scale 1001, a pattern used for detecting a position is provided, and interference light is generated by irradiating the pattern with light. The detection head 1002 detects a change in the measurement direction of the interference light and outputs a detection signal DET as an electrical signal representing the detection result to the signal processing unit 1003. The detection signal DET corresponds to the above-described analog input signal AIN. In other words, the scale 1001 and the detection head 1002 configure a displacement detector that detects a relative displacement between the scale 1001 and the detection head 1002.

The signal processing unit 1003 is mounted with the A/D converter 100 according to the embodiment, and converts the received detection signal DET into the digital signal OUT. The digital signal OUT is output to an arithmetic unit 1003A or the like and is used for generating an origin signal or for detecting a position.

As described above, the A/D converter 100 according to the embodiment can be mounted on an apparatus such as a displacement detecting apparatus. As a result, in the apparatus on which the A/D converter 100 is mounted, the A/D conversion of a signal can be performed with high speed and low power consumption while suppressing an error in the A/D conversion.

Second Embodiment

Figure 6:
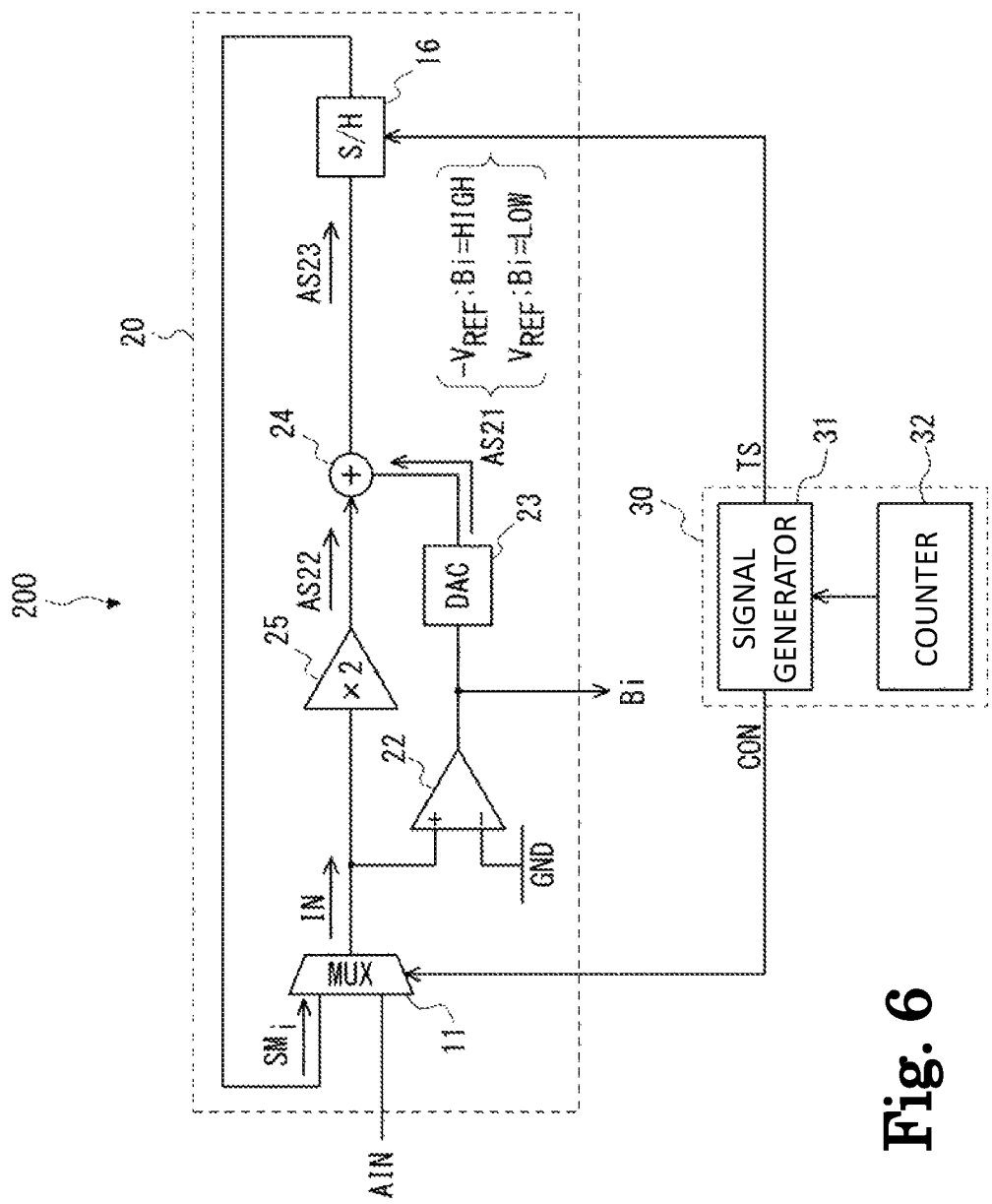
FIG. 6 is a diagram schematically illustrating a configuration of an analog-to-digital converter according to a second embodiment.

Next, an A/D converter according to a second embodiment will be described. The A/D converter according to the second embodiment is a modification example of the A/D converter 100 according to the first embodiment. FIG. 6 schematically illustrates a configuration of the A/D converter 200 according to the second embodiment. The A/D converter 200 has a configuration in which the cycle processing unit 10 of the A/D converter 100 is replaced with a cycle processing unit 20. As in the cycle processing unit 10, the cycle processing unit 20 converts an analog input signal AIN into a digital signal OUT having a plurality of bits by performing cycle processing on the analog input signal AIN in the A/D converter 200 to acquire values of each bit in order from the higher-order bit to the lower-order bit. The control unit 30 controls the cycle processing to be performed by the cycle processing unit 20 by applying a control signal CON and a timing signal TS to the cycle processing unit 20.

Hereinafter, the configuration of the cycle processing unit 20 will be described. The cycle processing unit 20 has a configuration in which the comparator 12, the D/A converting circuit 13, the subtractor 14, and the amplifier 15 of the cycle processing unit 10 are replaced with a comparator 22, a D/A converting circuit 23, an adder 24, and an amplifier 25, respectively. Since the selection circuit 11 is the same as that of the A/D converter 100, the description thereof will not be repeated.

The comparator 22 compares the input signal IN output from the selection circuit 11 with a ground voltage GND (that is, a zero voltage) to output the comparison result as a binary signal Bi. When the voltage of the input signal IN is higher than the ground voltage GND, the comparator 22 outputs "1" (HIGH) as the binary signal Bi. When the voltage of the input signal IN is lower than the ground voltage GND, the comparator 22 outputs "0" (LOW) as the binary signal Bi. When the voltage of the input signal IN is equal to the ground voltage GND, the comparator 22 may output "0" (LOW) or "1" (HIGH) as the binary signal Bi as necessary.

In addition, the digital signal OUT including the higher-order bit to the lower-order bit is represented by the binary signal Bi output from the comparator 22 in each of the N times cycle processing.

The D/A converting circuit 23 converts the binary signal Bi output from the comparator 22 into an analog signal AS21. When the binary signal Bi is "1" (HIGH), the D/A converting circuit 23 outputs $-V_{REF}$ as the analog signal AS21. When the binary signal Bi is 0" (LOW), the D/A converting circuit 23 outputs $+V_{REF}$ as the analog signal AS21.

The amplifier 25 amplifies the voltage of the input signal IN double and outputs the amplified voltage as an analog signal AS22.

The adder 24 adds the analog signal AS21 and the analog signal AS22 and outputs an analog signal AS23.

As in the first embodiment, according to the timing signal TS output from the control unit 30, the S/H circuit 16 samples the analog signal AS23 output from the adder 24 and outputs the sampled signal as the sample signal $SM_i$.

As described above, in the above-described configuration, by using the cycle processing unit 20, the same cycle processing as those of the first embodiment can be performed.

Here, the analog input signal applied to the A/D converter 100 is set as AIN1, and the analog input signal applied to the A/D converter 200 is set as AIN2. In this configuration, the voltage as the comparison target in the comparator 22 is the ground voltage GND. Therefore, when the voltage of AIN2 is lower than the voltage of AIN1 by the reference voltage $V_{REF}$ (AIN2=AIN1$-V_{REF}$), the A/D conversion result of the analog input signal AIN1 in the A/D converter 100 is the same as the A/D conversion result of the analog input signal AIN2 in the A/D converter 200.

Other Embodiments

The present disclosure is not limited to the above-described embodiments and can be appropriately modified within a range not departing from the scope. For example, the configurations of the cycle processing units 10 and 20 are not limited to the above-described configurations. The cycle processing unit may have another configuration as long as it can realize the cycle operation of the cyclic A/D converter.

For example, the configuration of the control unit 30 of the A/D converter 100 is not limited to the above-described configuration. The control unit may have another configuration as long as it can realize the cycle operation of the cyclic A/D converter.

In addition, in the description of the above-described embodiments, the amplification rate of the amplifier 15, 25 of the cycle processing unit 10, 20 are 2 (double), but the present disclosure is not limited thereto. That is, the cycle processing unit that can realize the cycle operation of the cyclic A/D converter may be configured using an amplifier having an amplification rate other than 2 (double).

In the above description, the displacement detecting apparatus is used as the apparatus on which the A/D converter 100 according to the embodiment is mounted, but the present disclosure is not limited thereto. The A/D converter may be mounted on other detecting apparatuses other than the displacement detecting apparatus or various apparatuses on which the A/D converter needs to be mounted other than the detecting apparatus.

In the description of the above-described embodiments, a 1-bit binary signal is obtained in one cycle processing, but the present disclosure is not limited thereto. For example, the A/D converter may include a cycle processing unit in which a digital signal having 2 bits or more can be obtained in one cycle processing. Even in this case, it is needless to say that, by reducing the period of the cycle processing according to the cycled number of the cycle processing, the A/D conversion of a signal can be performed with high speed and low power consumption while suppressing an error in the A/D conversion.

10 cycle processing unit
11 selection circuit
12, 22 comparator
13, 23 D/A converting circuit
14 subtractor
15, 25 amplifier
16 S/H circuit
20 cycle processing unit
24 adder
30 control unit
31 signal generator
32 counter
100 analog-to-digital converter (A/D converter)
1000 optical encoder
1001 scale
1002 detection head
1003 signal processing unit
AIN analog input signal
AS11 to AS13, AS21 to AS23 analog signal
Bi binary signal
CON control signal
DET detection signal
IN input signal
OUT digital signal
$SM_i$ sample signal
TS timing signal
$V_{REF}$ reference voltage

What is claimed is:

1. An analog-to-digital converter comprising:
   a cycle processing unit configured to convert an analog input signal into a digital signal having a plurality of bits by performing a plurality of cycle processing on the analog input signal to acquire values of each bit of the plurality of bits in order from a higher-order bit to a lower-order bit of the plurality of bits, the plurality of bits being a value of "N", which represents an integer of 2 or more, the cycle processing unit converting the analog input signal into the digital signal having N bits by performing the cycle processing N times on the analog input signal to acquire a 1-bit value in each of the cycle processing; and
   a control unit configured to control the cycle processing unit such that a period of the cycle processing is shortened according to a cycled number of the cycle processing, wherein:
   "τ" represents a time constant of the analog-to-digital converter, and "i" represents an integer of 1 to N, and
   a period "Ti" of the cycle processing between (i+1)-th cycle processing and i-th cycle processing is represented by the following expression:

$Ti > \tau\{(N-1)\ln 2 + \ln(N-1)\}$.

2. The analog-to-digital converter according to claim 1, wherein:
   an input signal used in first cycle processing is the analog input signal,
   an input signal used in the (i+1)-th cycle processing is a sample signal that is sampled in the i-th cycle processing,
   in a case where an i-th bit obtained in the i-th cycle processing is "1", the cycle processing unit subtracts a reference voltage from a voltage of the input signal, and samples a voltage obtained by amplifying the subtracted value by double to generate the sample signal, and
   in a case where the i-th bit is "0", the cycle processing unit samples a voltage obtained by amplifying the input signal by double to generate the sample signal.

3. The analog-to-digital converter according to claim 2, wherein:
   in a case where the input signal has a voltage higher than the reference voltage, the i-th bit is "1", and
   in a case where the input signal has a voltage lower than the reference voltage, the i-th bit is "0".

4. The analog-to-digital converter according to claim 3, wherein the cycle processing unit includes:
   a comparator that compares the input signal with the reference voltage to output a comparison result as the i-th bit;
   a digital to analog (D/A) converting circuit that outputs the reference voltage in a case where the i-th bit is "1";
   a subtractor that outputs a voltage obtained by subtracting an output voltage of the D/A converting circuit from the input signal;
   an amplifier that amplifies the voltage output from the subtractor by double; and
   a sample holding circuit that samples a voltage amplified by the amplifier to output the sample signal.

5. The analog-to-digital converter according to claim 4, wherein the control unit controls the period by controlling a timing at which the sample holding circuit performs sampling.

6. The analog-to-digital converter according to claim 4, wherein:
   the cycle processing unit further includes a selection circuit that outputs one of the analog input signal and the sample signal to the comparator as the input signal, the analog signal being input to one input terminal of the selection circuit, and the sample signal being input from the sample holding circuit to another input terminal of the selection circuit, and
   the control unit controls the selection circuit such that the selection circuit outputs the analog input signal as the input signal in the first cycle processing, and outputs the sample signal as the input signal in second or subsequent cycle processing.

7. The analog-to-digital converter according to claim 1, wherein:
   an input signal used in first cycle processing is the analog input signal,
   an input signal used in the (i+1)-th cycle processing is a sample signal that is sampled in the i-th cycle processing,
   in a case where an i-th bit obtained in the i-th cycle processing is "1", the cycle processing unit samples a voltage obtained by subtracting a reference voltage from a voltage obtained by amplifying the input signal by double to generate the sample signal, and
   in a case where the i-th bit is "0", the cycle processing unit samples a voltage obtained by adding the reference voltage to a voltage obtained by amplifying the input signal by double to generate the sample signal.

8. The analog-to-digital converter according to claim 7, wherein:
   in a case where the input signal has a voltage higher than a ground voltage, the i-th bit is "1", and in a case where the input signal has a voltage lower than the ground voltage, the i-th bit is "0".

9. The analog-to-digital converter according to claim 8, wherein the cycle processing unit includes:
- a comparator that compares the input signal with the ground voltage to output a comparison result as the i-th bit;
- a digital to analog (D/A) converting circuit that outputs a voltage obtained by inverting a sign of the reference voltage in a case where the i-th bit is "1", and outputs the reference voltage in a case where the i-th bit is "0";
- an amplifier that amplifies a voltage of the input signal by double;
- an adder that adds a voltage amplified by the amplifier and an output voltage of the D/A converting circuit to each other; and
- a sample holding circuit that samples a voltage added by the adder to output the sample signal.

10. The analog-to-digital converter according to claim 9, wherein the control unit controls the period by controlling a timing at which the sample holding circuit performs sampling.

11. The analog-to-digital converter according to claim 9, the cycle processing unit further includes a selection circuit that outputs any one of the analog input signal and the sample signal to the comparator as the input signal, the analog signal being input to one input terminal of the selection circuit, and the sample signal being input from the sample holding circuit to another input terminal of the selection circuit, and
the control unit controls the selection circuit such that the selection circuit outputs the analog input signal as the input signal in the first cycle processing, and outputs the sample signal as the input signal in second or subsequent cycle processing.

12. A displacement detecting apparatus comprising:
- a displacement detector that outputs an analog signal representing a measured displacement; and
- a signal processing unit configured to detect a displacement based on the analog signal representing the measured displacement, the signal processing unit including:
  - an analog-to-digital converter including:
    - a cycle processing unit configured to convert an analog input signal into a digital signal having a plurality of bits by performing a plurality of cycle processing on the analog input signal to acquire values of each bit of the plurality of bits in order from a higher-order bit to a lower-order bit of the plurality of bits, and
    - a control unit configured to control the cycle processing unit such that a period of the cycle processing is shortened according to a cycled number of the cycle processing; and
  - an arithmetic unit configured to calculate the displacement based on the digital signal output from the analog-to-digital converter,
  wherein the analog-to-digital converter receives an analog signal representing the measured displacement as the analog input signal to convert the received analog signal into the digital signal.

13. An analog-to-digital conversion method in which an analog input signal is converted into a digital signal having a plurality of bits by performing a plurality of cycle processing on the analog input signal to acquire values of each bit of the plurality of bits in order from a higher-order bit to a lower-order bit of the plurality of bits, the plurality of bits being a value of "N", which represents an integer of 2 or more, the cycle processing unit converting the analog input signal into the digital signal having N bits by performing the cycle processing N times on the analog input signal to acquire a 1-bit value in each of the cycle processing, the method comprising a step of:
- controlling the cycle processing such that a period of the cycle processing is shortened according to a cycled number of the cycle processing, wherein:
  - "$\tau$" represents a time constant of the analog-to-digital converter, and "i" represents an integer of 1 to N, and
  - a period "Ti" of the cycle processing between (i+1)-th cycle processing and i-th cycle processing is represented by the following expression:

$$Ti > \tau\{(N-1)\ln 2 + \ln(N-1)\}.$$

* * * * *